United States Patent
Merlin et al.

(10) Patent No.: US 6,781,227 B2
(45) Date of Patent: Aug. 24, 2004

(54) COMPRESSION ASSEMBLED ELECTRONIC PACKAGE HAVING A PLASTIC MOLDED INSULATION RING

(75) Inventors: Mario Merlin, Turin (IT); Aldo Torti, Turin (IT); Stefano Santi, Guanzate (IT)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/057,399

(22) Filed: Jan. 25, 2002

(65) Prior Publication Data

US 2003/0141517 A1 Jul. 31, 2003

(51) Int. Cl.⁷ .......................... H01L 29/73; H01L 23/48; H01L 23/34; H01L 27/082
(52) U.S. Cl. .................. 257/692; 257/181; 257/688; 257/724; 257/584
(58) Field of Search .................. 257/181, 692, 257/688, 584, 724, 696

(56) References Cited

U.S. PATENT DOCUMENTS

| | | | |
|---|---|---|---|
| 3,599,057 A | | 8/1971 | Lootens ................... 317/234 |
| 3,831,067 A | * | 8/1974 | Wislocky et al. ........... 317/234 |
| 4,008,486 A | | 2/1977 | Byczkowski .................. 357/74 |
| 5,278,434 A | * | 1/1994 | Niwayama ................... 257/181 |
| 5,641,976 A | * | 6/1997 | Taguchi et al. ............. 257/178 |

FOREIGN PATENT DOCUMENTS

| | | | |
|---|---|---|---|
| JP | 55-050659 | * | 4/1980 |
| JP | 55-134941 | * | 10/1980 |
| JP | 62-176137 | * | 8/1987 |
| JP | 63-64345 | * | 3/1988 |

* cited by examiner

*Primary Examiner*—Kamand Cuneo
*Assistant Examiner*—James M Mitchell
(74) *Attorney, Agent, or Firm*—Ostrolenk, Faber, Gerb & Soffen, LLP

(57) ABSTRACT

A compression assembled semiconductor package for housing a power semiconductor die which includes two major pole pieces in intimate electrical contact with respective major electrodes of a power semiconductor die. The package includes a plastic molded insulation ring disposed around the power semiconductor die. The pole pieces are secured to respective ends of the plastic molded insulation ring. One of the pole pieces may include an annular flange that penetrates the plastic molded insulation ring from an interior wall thereof and is embedded in its body. An annular flange may also be embedded in the plastic molded insulation ring and connected to an annular rib of a pole piece by a circular connector.

6 Claims, 7 Drawing Sheets

COMPRESSION ASSEMBLED ELECTRONIC PACKAGE HAVING A PLASTIC MOLDED INSULATION RING

BACKGROUND OF THE INVENTION

This application relates to high power compression assembled semiconductor packages, and more particularly to a compression assembled semiconductor package that houses a high power semiconductor switching die.

Compression assembled packages for housing high power semiconductor elements are well known. These packages generally resemble a hockey puck and include a power semiconductor die, which may be a thyristor, having a control electrode and a major electrode on a major surface thereof, and another major electrode on its opposing major surface. Typically, in these packages, two relatively large pole pieces are pressed by outside supports in surface-to-surface electrical contact with the major electrodes of the semiconductor die.

Typically, an annular insulation ring comprising a dielectric ceramic is disposed around the semiconductor die. The pole pieces are then directly connected to respective ends of the annular insulation ring by, for example, brazing and retain the semiconductor die within the annular insulation ring due to the pressure from the outside supports. Also, typically such well known compression assembled packages include a structure that allows a control signal to be carried from an external control circuit to the control electrode of the semiconductor die, whereby the semiconductor die may be switched ON to allow conduction between the poles of the package and OFF to prevent the conduction. Hence, compression assembled semiconductor packages find much use as switching devices within an electronic circuit.

SUMMARY OF THE INVENTION

A compression assembled semiconductor package according to the present invention includes a semiconductor device which is in surface-to-surface electrical contact and secured between respective surfaces of a top pole piece and a bottom pole piece. An annular insulation ring which is made from a molded plastic is disposed around the semiconductor die. The bottom pole piece includes a radially extending flange which penetrates the interior wall of the annular insulation ring and is embedded therein. An annular flange also penetrates and is embedded in the annular insulation ring at one end thereof. The top pole piece includes a rib which connects to the annular flange through a circular connector, thereby connecting the top pole piece to the package. As a result, the semiconductor die is held in place within the annular insulation ring by being compressed between the two pole pieces.

In one embodiment, the compression assembled semiconductor package of the present invention includes a control lead which extends from its interior to its exterior. The control lead is preferably a copper tab which is electronically connected to the control terminal of the semiconductor die by a bond wire. Together, the bond wire and the control lead form a control signal carrier for the compression assembled semiconductor package which will be connected to a control circuit.

In another embodiment of the present invention, a resilient L-shaped spring tab is welded at one end to the control lead that extends from the interior of the annular insulation ring to its exterior. The other end of the L-shaped spring tab is urged to form an intimate electrical contact with the control electrode of the semiconductor die due to the biasing force of the resilient body of the L-shaped spring tab.

In yet another embodiment, the control signals are transmitted to the control electrode of the semiconductor die by a spring tab. The spring tab in this embodiment is a unitary body that includes one portion which extends through the body of the annular insulation ring to the exterior thereof. The portion of the spring extending outside of the annular insulation ring acts as a control lead. The spring tab of this embodiment is also resilient and includes a head portion which is kept in intimate electrical contact with the control electrode of the semiconductor die due to the biasing force exerted by the springy, resilient body of the spring tab.

A compression assembled semiconductor package according to the present can be assembled easily, using less expensive parts with no sacrifices in electrical or thermal performance.

Other features and advantages of the present invention will become apparent from the following description of the invention which refers to the accompanying drawings.

BRIEF DESCRIPTION OF THE DRAWING(S)

DETAILED DESCRIPTION OF THE PREFERRED EMBODIMENT

Figure 1:
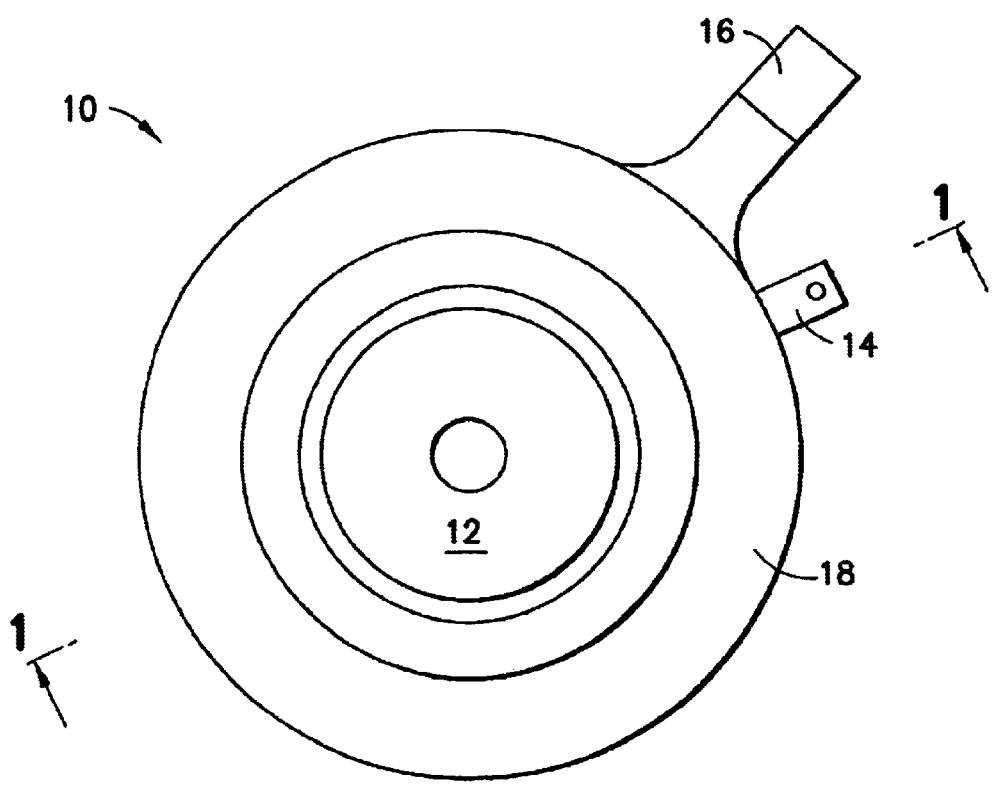
FIG. 1 shows the top view of a compression assembled semiconductor package according to the present invention.

Referring to FIG. 1, compression assembled semiconductor package 10 includes top pole piece 12, which is preferably made from a good conductor such as copper or a copper alloy having good electrical conductivity. Control lead 14 extends radially outward from the body of compression assembled semiconductor package 10. Control lead 14 is connectable electrically to an external control circuit (not shown) which supplies control signals to the control electrode of a semiconductor die (described later) contained within compression assembled semiconductor package 10. Connection terminal 16 extends radially outward and is electrically connected to top pole piece 12 by circular connector 18 which is annularly disposed around top pole piece 12. Connection terminal 16 is connectible to external elements in a power circuit and serves as a power terminal for the compression assembled semiconductor package 10.

Figure 2:
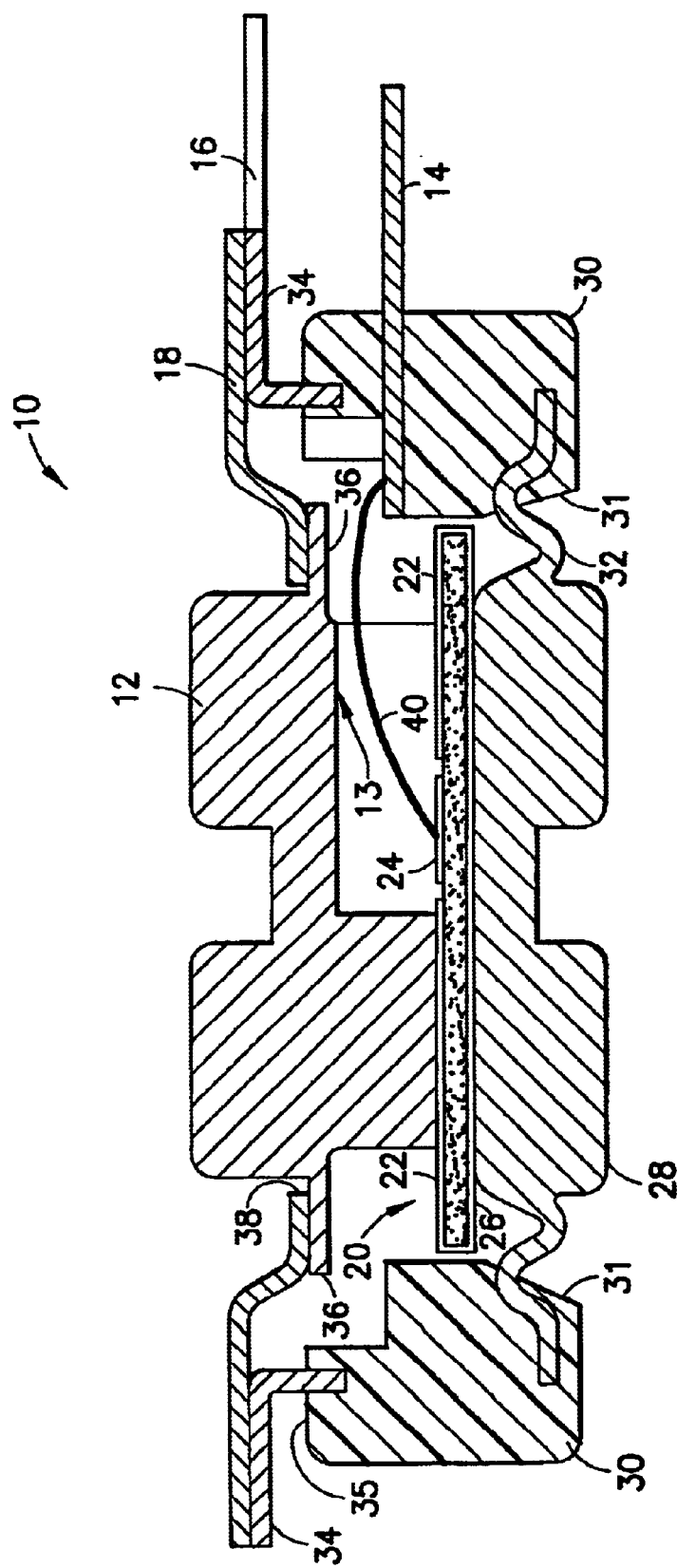
FIG. 2 shows the cross-section of the first embodiment of a compression assembled semiconductor package looking in the direction of line 1—1 in FIG. 1.

FIG. 2, in which like numerals identify like features, shows a cross-section of compression assembled semiconductor package 10 of FIG. 1 looking in the direction line 1—1 according to the first embodiment of the present invention. As shown in FIG. 2, compression assembled semiconductor package 10 according to the present invention includes a semiconductor die 20, which may be a thyristor, a MOSFET, an IGBT or other suitable semiconductor device. Semiconductor die 20 includes first major electrode 22 and control electrode 24 disposed on its first major surface, and second major electrode 26 on an opposing major surface. Top pole piece 12 is in intimate electrical surface-to-surface contact with first major electrode 22 of semiconductor die 20; while pole piece 28 is in intimate, surface-to-surface, electrical contact with second major electrode 26 of semiconductor die 20. The intimate contact between the pole pieces and respective electrodes of semiconductor die 20 holds the die in place.

Compression assembled semiconductor package 10 includes an annular insulation ring 30 which is disposed around semiconductor die 20. Insulation ring 30 is molded from an insulating plastic material and is preferably formed using a transfer molding process. Bottom pole piece 28 includes an annular flange 32 that is integrally connected to and radially extends from the outer surface of bottom pole piece 28. Preferably, bottom pole piece 28 and its annular flange 32 form a unitary body. Annular flange 32 penetrates the inner wall 31 of annular insulation ring 30 and is embedded therein. To embed annular flange 32 in annular insulation ring 30, annular flange 32 can be molded together with annular insulation ring 30. Alternatively, annular insulation ring 30 may be molded with an appropriate groove which will then receive annular flange 32 of bottom pole piece 28. Thereafter, a high temperature epoxy may be used to seal any opening between annular flange 32 and the groove in which it is received.

Compression assembled semiconductor package 10 also includes an annular flange 34 that penetrates top end 35 of annular insulation ring 30 and is embedded therein. Preferably, annular flange 34 is co-molded with annular insulation ring 30. Alternatively, annular insulation ring 30 may be molded with a cavity for receiving flange 34. In the case of the alternative process, a high temperature epoxy may be used to seal any opening between the cavity in annular insulation ring 30 and flange 34. Connection tab 16 forms a unitary body with annular flange 34 and extends radially from an outer periphery thereof.

Top pole piece 12 of compression assembled semiconductor package includes rib 36 extending radially from the outer surface thereof. Rib 36 and top pole piece 12 are integrally connected and form a unitary body. Rib 36 connects top pole piece 12 to annular flange 34 by circular connector 18. Circular connector 18 has a central opening 38 that is wide enough to receive top pole piece 12 but is too narrow to allow rib 36 to pass. Rib 36 and circular connector 18, therefore, come into surface-to-surface contact, and are preferably welded to one another. Circular connector 18 is also welded to annular flange 34, preferably by cold welding, thereby electrically connecting first major electrode 22 of semiconductor device 20 to connection tab 16 through top pole piece 12.

Compression assembled semiconductor package 10 also includes control lead 14 which extends through the body of annular insulation ring 30 the exterior thereof. Preferably, control lead 14 comprises a copper tab. In the first embodiment of the present invention, a bond wire 40 is electrically connected at one end thereof to an upper exposed surface of control lead 14 which is disposed within annular insulation ring 30. The other end of bond wire 40 is connected to control electrode 24 of semiconductor die 20. Top pole piece 12 includes a groove 13 which allows bond wire 40 to reach control electrode 24 of semiconductor die 20 where bond wire 40 is connected to control lead 14. Together, bond wire 40 and control lead 14 form a control signal carrier that transmits from a control circuit control signals to control electrode 24 of semiconductor die 20

Figure 3:
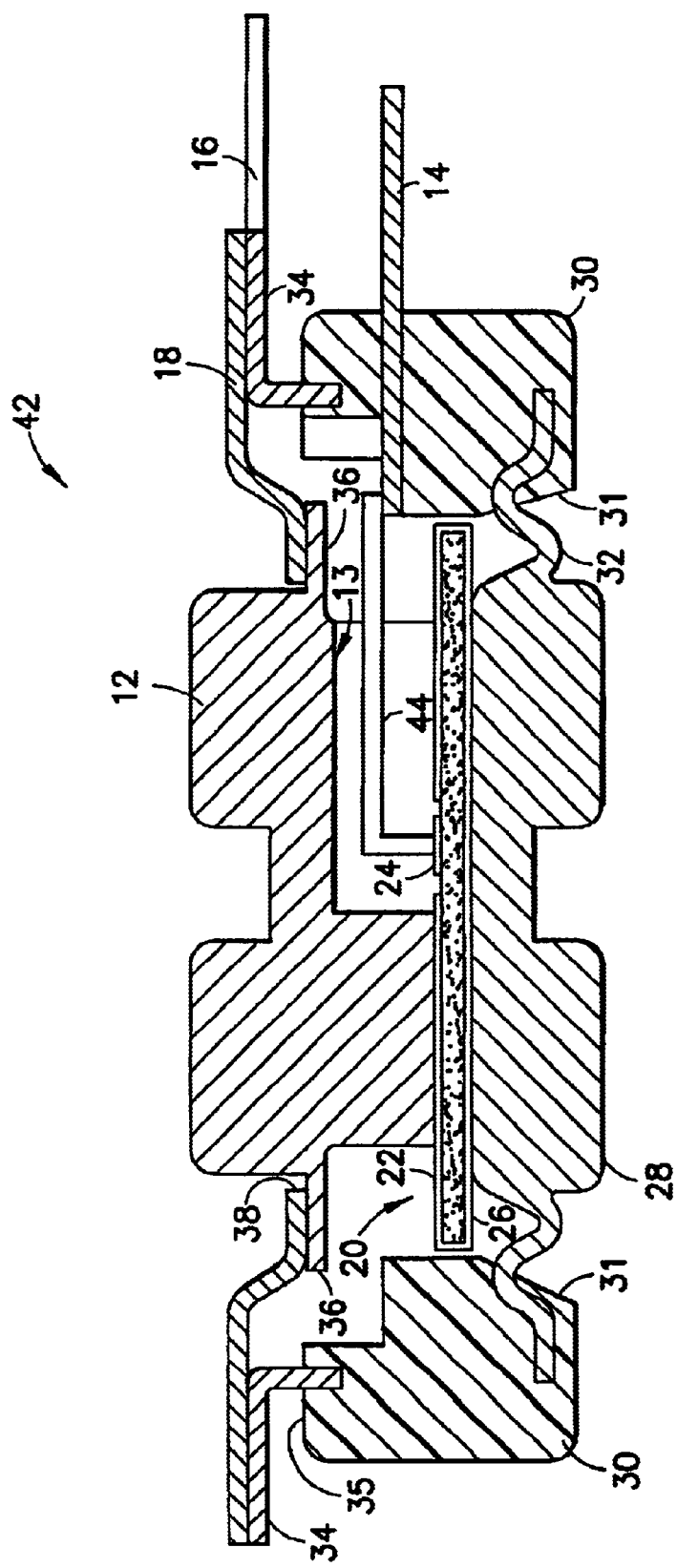
FIG. 3 shows the cross-section of the second embodiment of a compression assembled semiconductor package looking in the direction of line 1—1 in FIG. 1.

FIG. 3, in which like numerals identify like features, show a second embodiment of a compression assembled semiconductor package. Compression assembled semiconductor package 42 includes a control signal carrier assembly comprising control lead 14, which may be a copper tab, and L-shaped spring tab 44. L-shaped spring tab 44 is welded to control lead 14 at one end and passes through groove 13 in top pole piece 12 to make electrical contact with control electrode 24 of semiconductor die 20 at its other end. The L-shaped spring tab 44 has a resilient and springy body which biases its end against control electrode 24 to ensure a good electrical contact.

Figure 4:
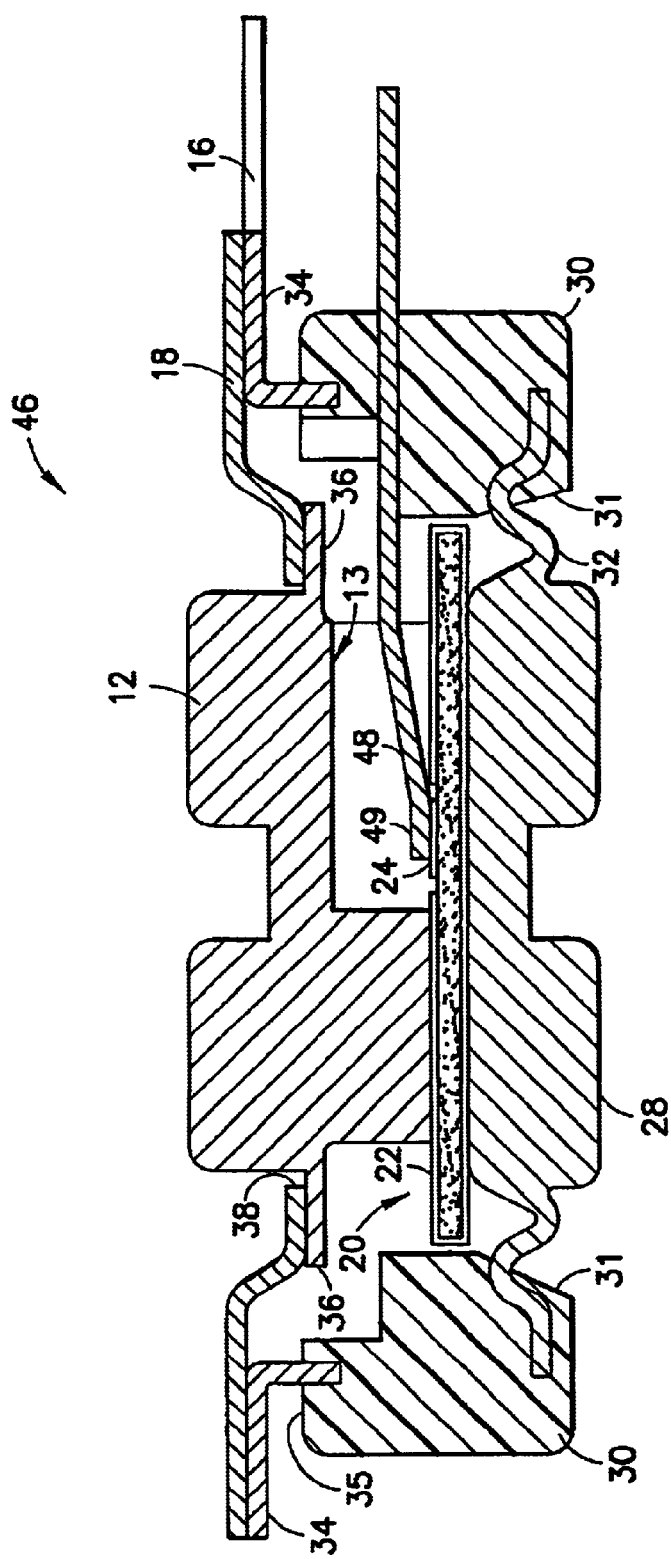
FIG. 4 shows the cross-section of the third embodiment of a compression assembled semiconductor package looking in the direction of line 1—1 in FIG. 1.

FIG. 4, in which like numerals identify like features, shows the fourth embodiment of a compression assembled semiconductor package. Compression assembled semiconductor package 46 includes a control signal carrier comprising spring tab 48. Spring tab 48 extends through annular insulation ring 30 from the interior to the exterior thereof. The portion of spring tab 48 which is outside of annular insulation ring 30 serves as the control lead which is connectable to a control circuit. Spring tab 48 has a resilient body and includes head 49 which is in intimate electrical contact with control electrode 24 of semiconductor die 20 due to the biasing force exerted in part by its resilience. Spring tab 48 can be placed in annular insulation ring 30 during its molding. Alternatively, a cavity may be provided in annular insulation ring 30 when it is molded to receive spring tab 48.

Figure 5:
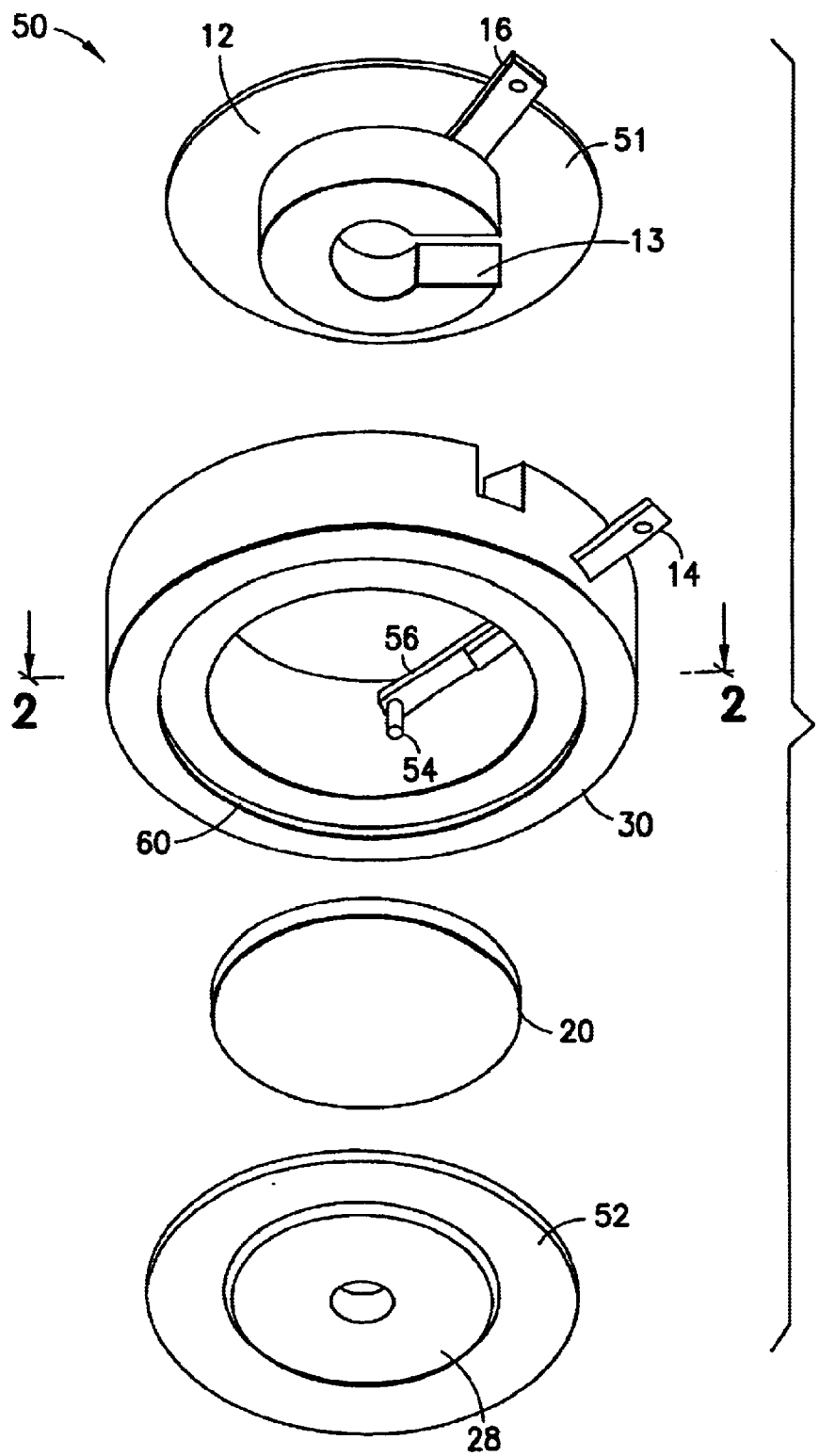
FIG. 5 is an exploded perspective view of the fourth embodiment of a compression assembled semiconductor package according to the present invention.

FIG. 5, in which like numerals identify like features, shows the fourth embodiment of a compression assembled semiconductor package according to the present invention. Compression assembled semiconductor package 50 according to the fourth embodiment includes an annular insulation ring 30 made from molded plastic, control lead 14 extending through the body of annular insulation ring 30, semiconductor die 20, top pole piece 12 and bottom pole piece 28. Semiconductor die 20 is round and is disposed within the circular interior space of annular insulation ring 30. Top pole piece 12 includes rim 51 which forms a unitary body therewith. Also, bottom pole piece 28 includes rim 52 which is integral and forms a unitary body therewith. In this embodiment, control pin 54 is provided to make intimate electrical contact at one end thereof with control electrode 24 of semiconductor die 20. The other opposing end of control pin 54 is connected electrically to control lead 14 by resilient conductive strip 56. Resilience of conductive strip 56 gives it a spring-like quality which biases control pin 54 against control electrode 24 of semiconductor die 20 to ensure good electrical contact. Control pin 54, conductive strip 56 and control lead 14 together form a control signal carrier for transmitting control signals to control electrode 24 of semiconductor die 20.

Figure 6:
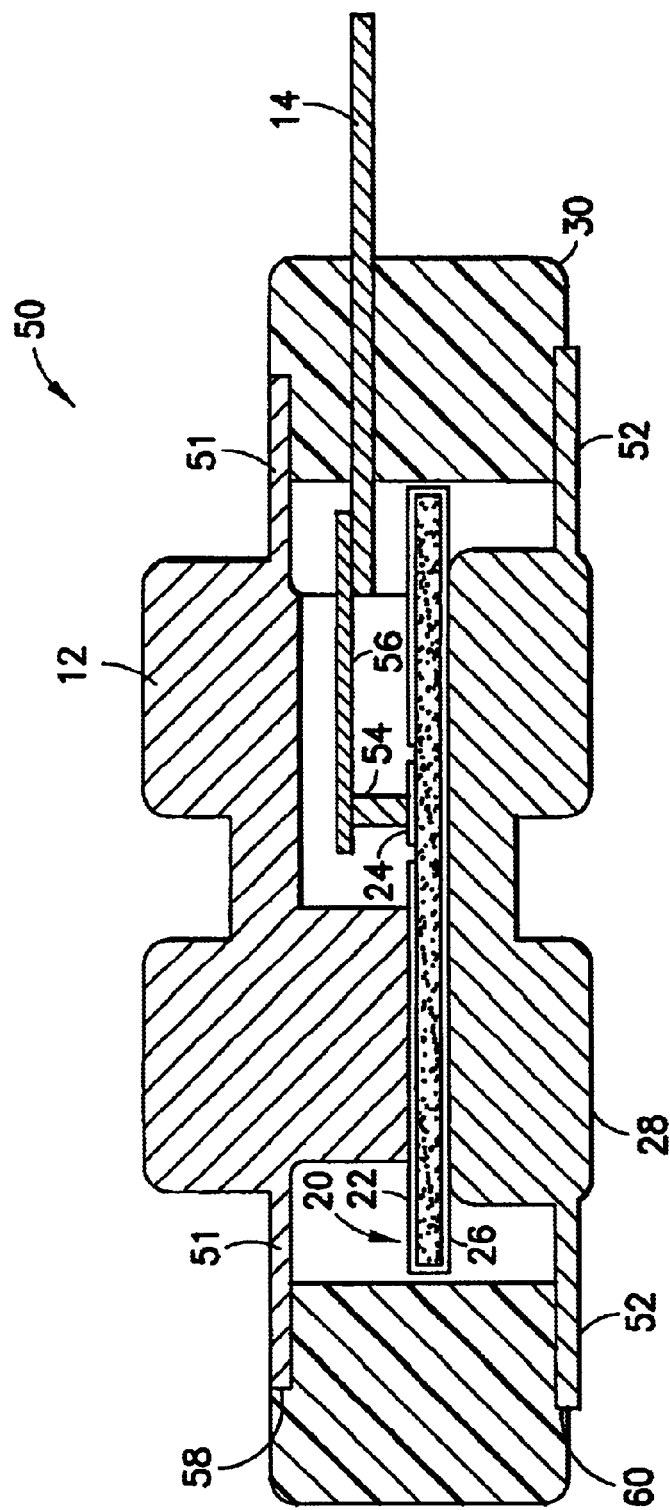
FIG. 6 is a cross-sectional view of the fourth embodiment looking in the direction of line 2—2 as shown in FIG. 5.

Referring to FIG. 6, rim 51 of top pole piece 12 is disposed within annular depression 58 at one end of annular insulation ring 30 and connected to the same by ultrasonic bonding. Rim 52 is disposed in annular depression 60 on an opposing end of annular insulation ring 30 and connected to the same by ultrasonic bonding as well.

Figure 7:
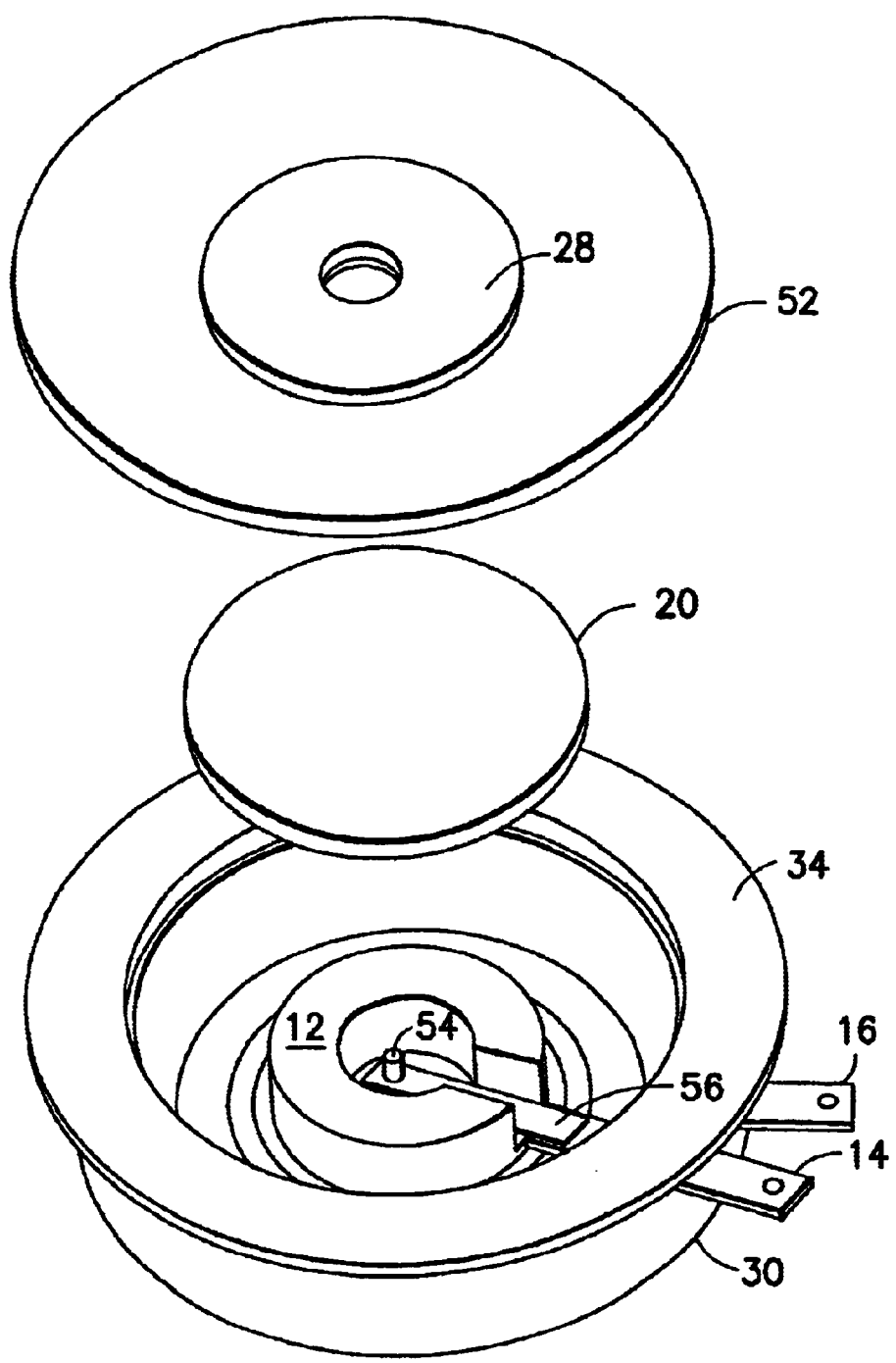
FIG. 7 is an exploded perspective view of a compression assembled semiconductor package according to the fifth embodiment.

FIG. 7, in which like numerals identify like features, shows a fifth embodiment. Compression assembled semiconductor package 62 according to the fifth embodiment includes annular insulation ring 30, which is made from a molded plastic. According to this embodiment, annular flange 34 is embedded at an end of annular insulation ring 30. Rim 52 of bottom pole piece 28 is connected by, for example, welding to annular flange 34. Top pole piece 12 in this embodiment may be secured to annular insulation ring 30 by being molded therewith as the bottom pole piece 28 in first, second and third embodiments, or by being ultrasonically bonded to an end thereof according to the fourth embodiment.

As one skilled in the art could appreciate, other variations of the present invention are possible. For example, a compression assembled semiconductor package having an annular insulation ring 30 made from molded plastic can have one pole structured according to the fourth embodiment and be ultrasonically bonded to an end of annular insulation ring 30 and the other pole secured to the annular insulation ring by being embedded therein or connected to a flange that is embedded therein according to the first, second and third embodiments.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A compression assembled semiconductor package comprising:
    a semiconductor die having a first major surface and a second major surface;
    a control electrode disposed on a first major surface of said semiconductor die, and first and second electrodes disposed on first and second major surfaces respectively of said semiconductor die;
    a molded plastic insulation ring annularly disposed around said semiconductor die;
    a control signal carrier extending through said molded insulation ring from the exterior thereof and electrically connected to said control electrode;
    a first pole being in surface-to-surface electrical contact with said first electrode; and
    a second pole being in surface-to-surface electrical contact with said second electrode, whereby said semiconductor die is held in place between said first pole and said second pole;
    wherein said first pole comprises and forms a unitary body with a rim, said rim being ultasonically bonded directly to an end of said molded plastic insulation ring.

2. The compression assembled semiconductor package of claim 1, wherein said first pole includes a groove to allow said control signal carrier to reach said control electrode.

3. The compression assembled semiconductor package of claim 1, wherein said semiconductor die is a thyristor.

4. The compression assembled semiconductor package of claim 1, wherein said first pole includes a connection tab extending radially away from its periphery.

5. The compression assembled semiconductor package of claim 1, wherein said control signal carrier comprises a control pin in electrical contact at one end thereof with said control electrode and electrically connected by a conductive strip to a lead that extends through the body of said molded plastic insulation ring.

6. A compression assembled semiconductor package comprising:
    a semiconductor die having a first major surface and a second major surface;
    a control electrode disposed on a first major surface of said semiconductor die, and first and second electrodes disposed on first and second major surfaces respectively of said semiconductor die;
    a molded plastic insulation ring annularly disposed around said semiconductor die;
    a control signal carrier extending through said molded insulation ring from the exterior thereof and electrically connected to said control electrode;
    a first pole being in surface-to-surface electrical contact with said first electrode; and
    a second pole being in surface-to-surface electrical contact with said second electrode, whereby said semiconductor die is held in place between said first pole and said second pole,
    wherein said second pole comprises and forms a unitary body with a rim, said rim being ultrasonically bonded directly to an end of said molded plastic insulation ring.

* * * * *